United States Patent
Tong et al.

(10) Patent No.: US 9,312,145 B2
(45) Date of Patent: Apr. 12, 2016

(54) CONFORMAL NITRIDATION OF ONE OR MORE FIN-TYPE TRANSISTOR LAYERS

(71) Applicant: GLOBALFOUNDRIES Inc., Grand Cayman (KY)

(72) Inventors: Wei Hua Tong, Mechanicville, NY (US); Tien-Ying Luo, Clifton Park, NY (US); Yan Ping Shen, Saratoga Springs, NY (US); Feng Zhou, Beacon, NY (US); Jun Lian, Mechanicville, NY (US); Haoran Shi, Saratoga Springs, NY (US); Min-hwa Chi, Malta, NY (US); Jin Ping Liu, Ballston Lake, NY (US); Haiting Wang, Clifton Park, NY (US); Seung Kim, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/200,197

(22) Filed: Mar. 7, 2014

(65) Prior Publication Data
US 2015/0255277 A1    Sep. 10, 2015

(51) Int. Cl.
| | | |
|---|---|---|
| H01L 21/469 | (2006.01) |
| H01L 21/324 | (2006.01) |
| H01L 29/78 | (2006.01) |
| H01L 29/51 | (2006.01) |
| H01L 21/02 | (2006.01) |
| H01L 21/321 | (2006.01) |

(52) U.S. Cl.
CPC .......... *H01L 21/324* (2013.01); *H01L 21/0234* (2013.01); *H01L 21/02332* (2013.01); *H01L 21/321* (2013.01); *H01L 29/512* (2013.01); *H01L 29/518* (2013.01); *H01L 29/785* (2013.01)

(58) Field of Classification Search
USPC ....................................................... 438/775
See application file for complete search history.

(56) References Cited

U.S. PATENT DOCUMENTS

| | | | |
|---|---|---|---|
| 2002/0064970 A1* | 5/2002 | Chooi et al. | 438/785 |
| 2002/0130377 A1 | 9/2002 | Khare et al. | |
| 2006/0273411 A1 | 12/2006 | Triyoso et al. | |
| 2008/0090425 A9 | 4/2008 | Olsen | |
| 2013/0214360 A1* | 8/2013 | Siprak | 257/365 |
| 2013/0277743 A1* | 10/2013 | Jagannathan et al. | 257/347 |
| 2013/0313643 A1* | 11/2013 | Doris et al. | 257/347 |

* cited by examiner

*Primary Examiner* — Asok K Sarkar
(74) *Attorney, Agent, or Firm* — Heslin Rothenberg Farley & Mesiti P.C.; Kristian E. Ziegler (57) ABSTRACT

Fin-type transistor fabrication methods and structures are provided having one or more nitrided conformal layers, to improve reliability of the semiconductor device. The method includes, for example, providing at least one material layer disposed, in part, conformally over a fin extending above a substrate, the material layer(s) including a gate dielectric layer; and performing a conformal nitridation process over an exposed surface of the material layer(s), the conformal nitridation process forming an exposed, conformal nitrided surface.

18 Claims, 8 Drawing Sheets

CONFORMAL NITRIDATION OF ONE OR MORE FIN-TYPE TRANSISTOR LAYERS

BACKGROUND OF THE INVENTION

Fin field-effect transistor (FinFET) devices continue to be developed to replace conventional planar metal oxide semiconductor field-effect transistors (MOSFETs) in advanced complementary metal oxide semiconductor (CMOS) technology. As is known, the term "fin" refers to a vertical structure within or upon which are formed, for instance, one or more FinFETs or other fin devices, including capacitors, diodes, etc. Advantageously, the fin structure having multiple gate structures, for instance, a double gate or tri-gate structure, wrapped around the fin structures or fins may be employed to help control current leakage through the transistor in the off-stage as well as other short-channel effects.

Enhancements in fin device structures and fabrication methods continue to be pursued for enhanced performance and commercial advantage.

BRIEF SUMMARY

The shortcomings of the prior art are overcome and advantages are provided through the provision, in one aspect, of a method which includes fabricating a fin-type transistor structure. The fabricating includes: providing at least one material layer disposed conformally over a fin extending above a substrate, the at least one material layer including a gate dielectric layer; and performing a conformal nitridation process over an exposed surface of the at least one material layer, the conformal nitridation process forming an exposed, conformal nitrided surface.

In a further aspect, a structure is provided which includes a fin-type transistor structure. The fin-type transistor structure includes: a gate dielectric layer disposed, at least in part, conformally over a fin of the fin-type transistor structure, the fin extending above a substrate; wherein an outer surface of the gate dielectric layer is an oxynitrided surface of the gate dielectric layer; and a capping layer disposed conformally over the oxynitrided surface of the gate dielectric layer, wherein an outer surface of the capping layer is a nitrided surface of the capping layer, where the oxynitrided surface of the gate dielectric layer and the nitrided surface of the capping layer, both include increased concentrations of nitrogen.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating embodiments of the invention, are given by way of illustration only, and are not by way of limitation. Various substitutions, modifications, additions, and/or arrangements, within the spirit and/or scope of the underlying inventive concepts will be apparent to those skilled in the art from this disclosure. Further, note that, in making reference below to the drawings (which are not drawn to scale for ease of understanding) the same reference numbers used throughout different figures designate the same or similar components.

In one aspect, during fabrication of a fin field-effect transistor (FinFET) device(s), a gate-first processing flow may be employed to fabricate one or more gate structures. In one embodiment, these gate structures wrap around one or more fins or fin structures. In the gate-first process, a gate structure or a gate stack structure (for instance, a multi-layered gate stack structure) may be disposed conformally over a fin structure and extending above a substrate. A multi-layered gate stack structure may include, for instance, one or more layers of a material and a sacrificial capping layer disposed over the material layer(s). For instance, the one or more material layers may include a gate dielectric layer, and one or more work-function layers disposed over the gate dielectric layer. The sacrificial capping layer, which may include or be fabricated of amorphous silicon layer (a-Si) or polysilicon layer (poly-Si), serves to protect the underlying material layer(s) during subsequent processing, such as annealing processes. The sacrificial capping layer may subsequently be removed by one or more etching process(es), such as wet or dry etching process. During fabrication, the one or more material layers of gate structure may be subjected to an undesirable oxidation and/or plasma etching environment, during one or more processing steps of fabrication processing, which could result in performance degradation of the resultant fin-type transistor structure, e.g., FinFET device. The fabrication process may proceed to pattern the gate stack structure using (for instance) masking steps and etching processes. The fabrication process may proceed further using typical process flow, for example, spacer formation, n and p junction formations, and inter-metal-dielectric (ILD) deposition, contacts, silicide, vias, and interconnection.

In another aspect, during fabrication of a fin field-effect transistor (FinFET) device(s), a gate-last or replacement metal gate (RMG) processing flow may also be employed to fabricate one or more gate structures. In one embodiment, these gate structures wrap around one or more fins or fin structures. In a RMG process, a sacrificial gate structure is formed and patterned. For instance, the sacrificial gate structure, which may include or be fabricated of, in one example, sacrificial gate material, such as amorphous silicon (a-Si) or polysilicon, holds the position for the subsequent metal gate (for instance, the RMG electrodes) electrodes to be formed. After spacer and n and p junctions are formed, a layer of inter-metal dielectric material (ILD) (also referred to herein as a layer of dielectric material) may be provided over the sacrificial gate structure and planarized using, for instance, chemical mechanical planarization (CMP) process, resulting in exposing an upper surface of the sacrificial gate structure. The exposed sacrificial gate structure may subsequently be removed to form a trench, within which a replacement metal gate structure (also referred to as RMG gate stack structure) may subsequently be provided. A RMG gate stack structure (for instance, a multi-layered gate stack structure) may be disposed conformally over a fin structure (for instance, within the trench) and extending above a substrate. A multi-layered gate stack structure may include, for instance, one or more layers of a material and a sacrificial capping layer disposed over the material layer(s). As noted above, the one or more material layers may include a gate dielectric layer, and one or more work function layers disposed over the gate dielectric layer. The sacrificial capping layer, which may include or be fabricated of amorphous silicon (a-Si) layer or polysilicon (poly-Si) layer, serves to protect the underlying material layer (s) during subsequent processing, such as annealing. During fabrication, the one or more material layers within the multi-layered gate stack structure (for instance, beneath the sacrificial capping layer) may be subjected to an undesirable oxidation and/or plasma etching environment, during one or more processing steps of fabrication processing, which could result in performance degradation of the resultant fin-type transistor structure, e.g., FinFET device. A non-selective chemical-mechanical polish may be employed to polish away excess layered gate structure materials, with the chemical-mechanical polishing terminating at an upper surface of the trench, resulting in the upper surface of layered gate structure being substantially coplanar with the upper surface of the trench. The fabrication process may proceed further using typical process flow, for example contacts, silicide, vias, and interconnection.

Figure 1:
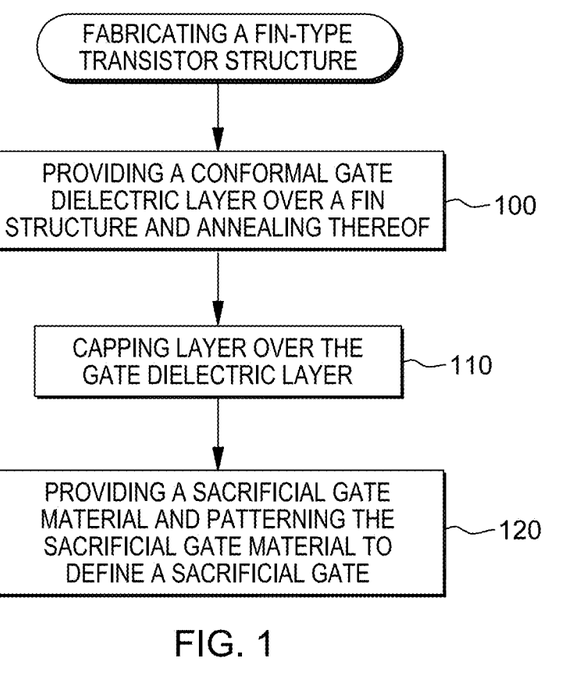
FIG. 1 depicts one embodiment of a process for fabricating a fin-type transistor structure using a gate-first approach.

As noted above, in a gate-first fabrication approach, one or more material layers may be provided conformally over one or more fin structures extending from a substrate. As depicted in FIG. 1, this approach may include providing a gate dielectric layer disposed, in part, conformally over a fin structure and a post deposition annealing process of the gate dielectric layer may optionally be performed 100. In one example, the gate dielectric layer may include an oxide material, such as metal-oxide material (for instance, hafnium oxide ($HfO_2$)). A capping layer is subsequently provided over the gate dielectric layer 110, for instance, using conventional deposition processes. As used herein, "capping layer" refers generally to any material film or layer which overlies, for instance, the gate dielectric layer. The capping layer may, in one embodiment, form part of the resultant gate structure, and may be or include one or more conformally-deposited work function layers, such as titanium nitride (TiN), tantalum nitride (TaN), etc. A sacrificial capping layer, such as amorphous silicon (a-Si) or polysilicon, is subsequently provided over the capping layer. The structure may then be subjected to a flash annealing process, for instance, in the presence of an oxygen atmosphere to facilitate removing one or more voids created within the gate dielectric layer and/or capping layer. The sacrificial capping layer may be subsequently removed using conventional wet or dry etching processes. However, the flash annealing process performed in ambient oxygen on the sacrificial capping layer may result in diffusion of oxygen into the underlying capping layer and/or the gate dielectric layers through the sacrificial capping layer. Additionally, the removal of the sacrificial capping layer using, for instance, dry or wet etching process, may damage the underlying capping layer and gate dielectric layer.

Figure 2:
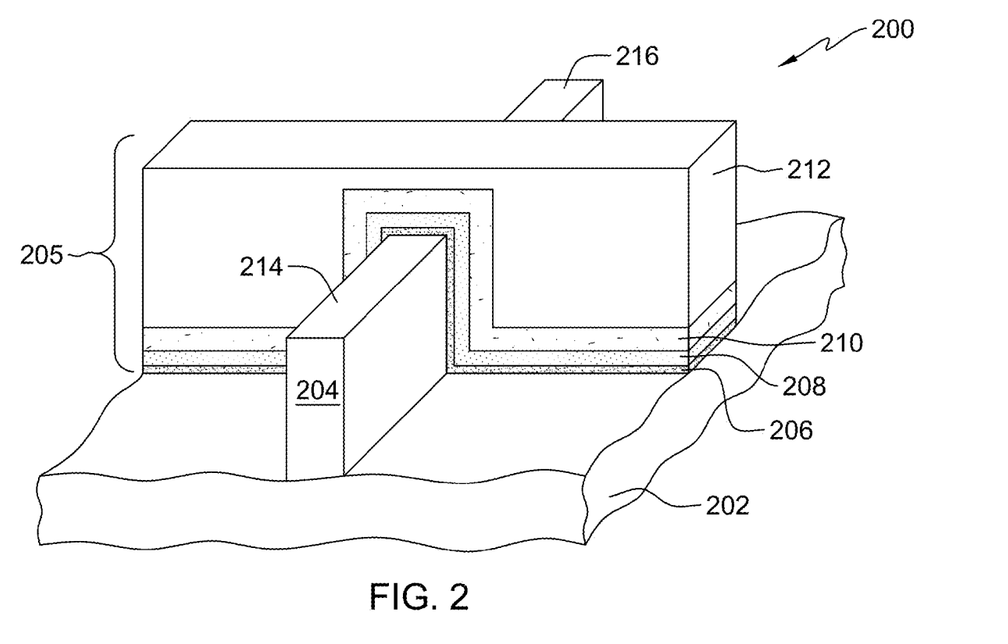
FIG. 2 depicts one embodiment of a fin-type transistor structure.

By way of further explanation, FIG. 2 depicts one embodiment of a fin-type transistor structure 200, obtained during a fin-type transistor fabrication, using a gate-first process flow.

In the example shown, fin-type transistor structure 200 includes a substrate 202, which may be (in one example) a bulk semiconductor material such as a bulk silicon wafer. As another example, substrate 202 may also include any silicon-containing substrate including, but not limited to single crystal Si, Si-on-nothing (SON), Si-on-insulator (SOI), or Si-on-replacement insulator (SRI) substrate and the like. As depicted, one or more fin structures 204 extend from substrate 202. By way of example, fin structure(s) 204 may be formed by removing one or more portions of substrate 202, thereby creating fins 204 of the same material as substrate 202, for example, a semiconductor or crystalline material. In another example, formation of fins 204 may also be achieved by patterning substrate 202 using various techniques, including: direct lithography; sidewall image transfer technique; extreme ultraviolet lithography (EUV); e-beam technique; litho-etch litho-etch; or litho-etch litho-freeze. Following patterning, removal may be performed, for example, by any suitable etching process, such as an anisotropic dry etching process, for instance, reactive-ion-etching (RIE) in sulfur hexafluoride ($SF_6$).

Continuing with FIG. 2, one or more gate structures 205 may be provided above fin(s) 204, and may overlap fin 204 in selected areas to operate as, for instance, the gate of a fin-type transistor, such as fin field-effect transistor (FinFETs) being fabricated in association with fin 204. Gate structure 205 may include one or more layers of materials disposed, in part, conformally over fin 204. The one or more material layers may include, for instance, an interfacial layer 206, a gate dielectric layer 208 disposed over interfacial layer 206, and a capping layer 210 disposed over gate dielectric layer 208. In one embodiment, interfacial layer 206 may include or be fabricated of, for instance, a layer of silicon oxide disposed conformally over fin 204, for instance, to protect the underlying fin 204 during subsequent processing. One skilled in the art will note that, interfacial layer 206 may be formed conformally over fin 204, due to oxidation of, for instance, silicon fin material during fabrication processing. The silicon fin material may chemically be oxidized during various pre-clean processes performed using, for instance, dilute hydrofluoric acid (DHF) solution and SC1 solution, often resulting in a thin layer or film of interfacial oxide on the surface of silicon fin material, forming the interfacial layer. In one example, the thickness of interfacial layer may be about 5° A to 10° A.

By way of an example, gate dielectric layer 208 may include an oxide material, such as a metal-oxide material. In one example, the metal-oxide material may be or include a high-k dielectric material with a dielectric constant k greater than about, for instance, 3.9 (note that k=3.9 for $SiO_2$), and may be deposited by performing a suitable deposition process, such as atomic layer deposition (ALD), physical vapor deposition (PVD), chemical vapor deposition (CVD), or the like. Example of high-k dielectric materials which may be used as gate dielectric layer include, but are not limited to, hafnium oxide, hafnium silicon oxide, lanthanum oxide, lanthanum aluminum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide and lead zinc niobate. One skilled in the art will know that, the gate dielectric layer is also susceptible to oxidation, owing to exposure to, for instance, various chemical etchants and plasma during subsequent processing, which could result in degradation of the gate dielectric layer, and in turn, affect reliability of the resultant fin-type transistor structure.

A capping layer 210 is provided over gate dielectric layer 208. By way of example, capping layer 210 may include or be fabricated of a nitride material, for example, titanium nitride (TiN), formed by CVD processing. Capping layer 210, of suitable thickness, facilitates in protecting the underlying gate dielectric layer 208 as well as incorporates a work function into the gate structure. However, capping layer 210 may disadvantageously be eroded by undesirable oxidation during subsequent fabrication processing. In one example, a titanium nitride capping layer 210 may become oxidized during subsequent processing to create an undesirable titanium oxynitride (TiON) layer or film, which may degrade the titanium nitride capping layer. One skilled in the art will note that this erosion of the capping layer would in turn, degrade reliability of the resultant fin-type transistor structure. The noted layers of fin-type transistor structure 200 of FIG. 2 may be formed using a variety of different materials and fabrication techniques, such as chemical vapor deposition (CVD), physical vapor deposition (PVD) or plasma-enhanced versions of such processes. The thickness of the depicted layers may also vary, depending on the particular structure or application.

Continuing with FIG. 2, gate structure 205 may further include a gate material 212 which, in one embodiment, may be a metal gate as part of a gate-first fabrication process. Note that the gate structure 205 depicted in FIG. 2 illustrates one embodiment of a gate structure patterned, using a gate-first flow. Alternatively, gate material 212 may be a sacrificial gate material, such as amorphous silicon (a-Si) or polycrystalline silicon (polysilicon), which may subsequently be replaced with a replacement gate material as part of a gate-last fabrication process. Fin-type transistor structure 200 may further include a source region 214 and a drain region 216, formed using any suitable processing techniques, including, for example, ion implantation, epitaxial growth of the embedded source/drain materials and activation anneals.

Described below are various enhanced fin-type transistor structures and methods of fabrication wherein one or more conformal nitrided surfaces (also referred to as nitrogen-rich surfaces), having increased concentrations of nitrogen, are provided over selected layers of the fin structure (s). For instance, the structures and the methods disclosed herein advantageously improve device performance by inhibiting oxidation of one or more layers of gate structures. In particular, increased concentrations of nitrogen on the surface of one or more selected conformal gate layers facilitate in sealing, and stabilizing oxygen contents disposed within gate stack layers, during subsequent process steps, and thereby enhancing device reliability of the resultant FinFET device(s).

Generally stated, provided herein, in one aspect, is a method which includes fabricating a fin-type transistor structure. The fabricating includes, for instance: providing at least one material layer disposed, in part, conformally over a fin extending above a substrate, the at least one material layer including a gate dielectric layer; and performing a conformal nitridation process over an exposed surface of the at least one material layer, the conformal nitridation process forming an exposed, conformal nitrided surface.

Figure 3A:
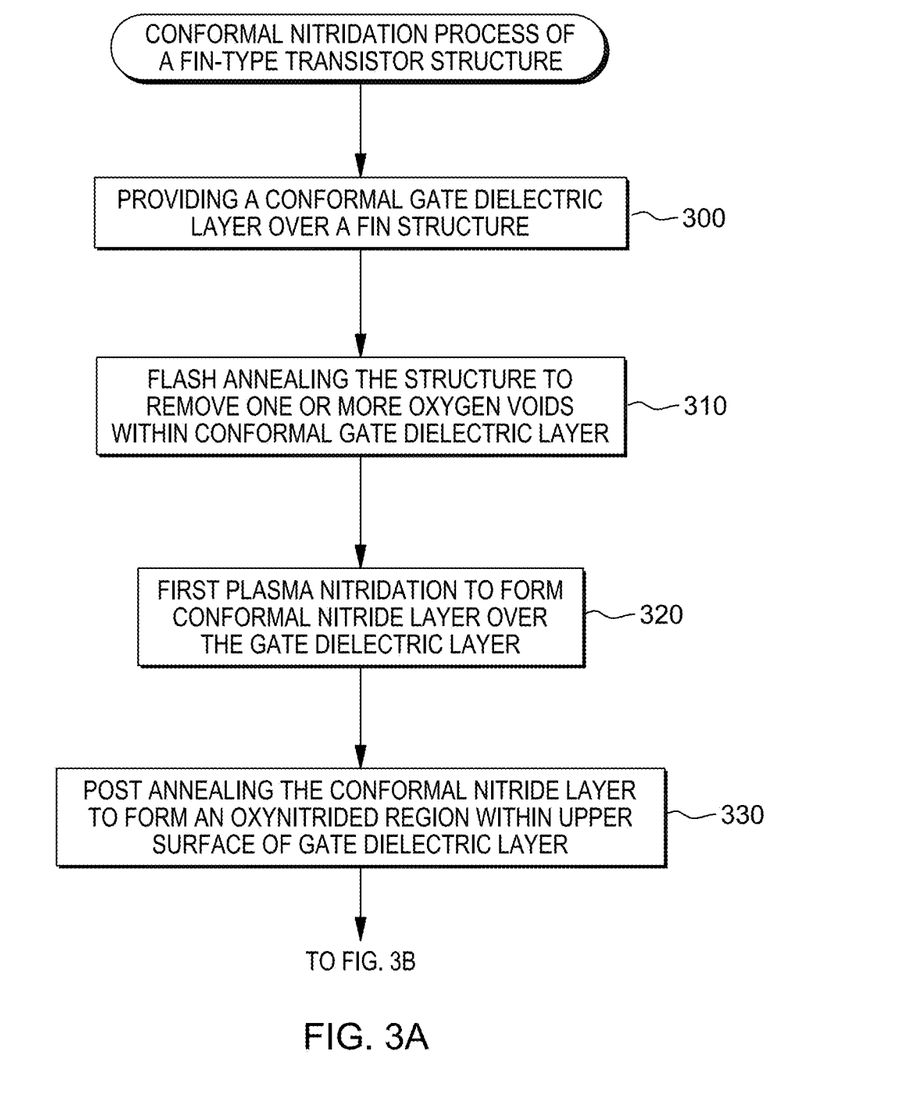
FIGS. 3A and 3B depicts one embodiment of a process for fabricating, for instance, a fin-type transistor structure, using a gate-first approach, in accordance with one or more aspects of the present invention.
Figure 3B:
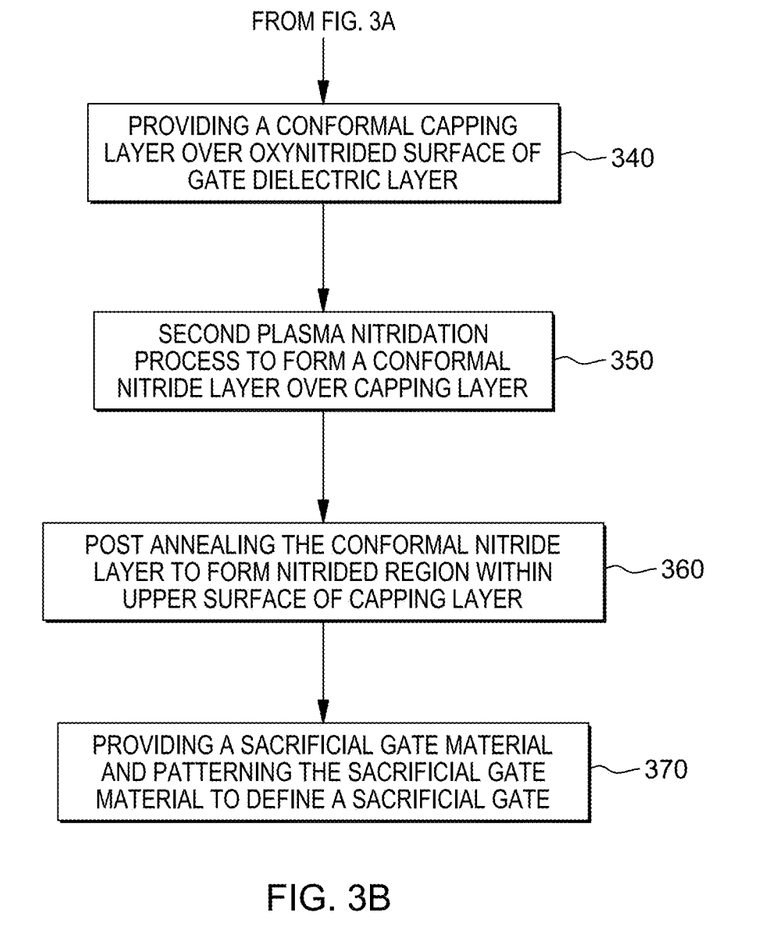

More particularly, as shown in FIGS. 3A-3B, in one embodiment, a method of fabricating a fin-type transistor structure (in accordance with one or more aspects of the present invention) may include providing one or more material layers conformally over a fin structure extending above a substrate 300, such as, a bulk silicon semiconductor substrate. The one or more material layers may include a gate dielectric layer. In one example, the gate dielectric layer may include an oxide material, such as a metal-oxide material (for instance, hafnium oxide ($HfO_2$)). The fin structure, including the gate dielectric layer, may optionally be subjected to a flash annealing process 310, for instance, in the presence of an oxygen atmosphere to facilitate removing one or more oxygen voids or oxygen vacancies created within the gate dielectric layer during deposition process. Note that, the flash annealing process facilitates the gate dielectric layer to be "saturated" with oxygen, thereby removing oxygen vacancies or voids disposed therein.

By way of example, a first conformal nitridation process may next be performed over the structure, for instance, over an exposed surface of the gate dielectric layer. This first conformal nitridation process includes a first plasma nitridation 320 over the exposed surface of the gate dielectric layer to form a conformal oxynitrided surface of the gate dielectric layer, which is rich in nitrogen content. In a specific example, the first plasma nitridation may be performed in the presence of a gaseous plasma material such as, for example, nitrogen or an ammonia gas at a temperature in the range of about 350° C. to 400° C. The conformal oxynitrided surface of the gate dielectric layer advantageously facilitates blocking exposure of the gate dielectric layer to subsequent fabrication processes, as well as facilitates sealing oxygen within the gate dielectric layer and preventing diffusion of oxygen from the surface. Note further that the oxynitrided surface of the gate dielectric layer has an increased concentration of nitrogen on the surface, which as noted inhibits oxidation of the underlying portion of the gate dielectric layer. The first conformal nitridation process may optionally include performing a post annealing process 330 using, for instance, a spike anneal, laser anneal or minute second annealing process with minimum atomic movement. This post annealing process advantageously enhances the nitrogen content on the oxynitrided surface, while minimizing the diffusion of nitrogen into the upper region of the gate dielectric layer. The post annealing process is performed to at least partially drive oxygen away from the conformal oxynitrided surface into ambient atmosphere, forming an oxynitrided region with increased concentration of nitrogen content within the upper portion of the gate dielectric layer. In the present example, this post annealing process may result in increased concentration of nitrogen within the upper portion of the gate dielectric layer. Note that the nitrogen is not to be overly diffused into the underlying gate dielectric layer in order not to degrade the dielectric characteristics as well as interface quality. In one example, the post annealing is preferred to be performed using the flash annealing or laser annealing (LSA) with high surface temperature, for instance, for a short period of time (~ms) so that there is minimum atomic diffusion into the underlying material.

The material layers may further include a capping layer disposed over the gate dielectric layer, for instance, directly on the gate dielectric layer. By way of example, capping layer may be disposed conformally over the oxynitrided surface of the gate dielectric layer 340. In one example, the capping layer may include a nitride material, such as titanium nitride (TiN). A second conformal nitridation process may then be performed over the capping layer of the structure. This second conformal nitridation process may include a second plasma nitridation 350 over the exposed surface of the capping layer to form a conformal nitrided surface of the capping layer, which is rich in nitrogen content. This second plasma nitridation may be performed in the presence of a gaseous plasma material such as, for example, nitrogen or an ammonia gas at a temperature in the range of about 350° C. to 400° C. at low operating pressure (<1 OmTorr). The conformal nitrided surface of the capping layer advantageously facilitates blocking exposure of the capping layer to subsequent fabrication processes. Note that the nitrided surface of the capping layer has an increased concentration of nitrogen, which advantageously inhibits oxidation of the underlying portion of the capping layer in subsequent processing. The second conformal nitridation process may optionally include performing a second post annealing process 360 using, for instance, a spike anneal, laser anneal or minute second annealing process with minimum atomic movement. This second post annealing process at least partially enhances nitrogen content in the conformal nitrided surface, forming a nitrided region within the upper portion of the capping layer. Thus, the increased concentrations of nitrogen within the oxynitrided region of the gate dielectric layer and/or nitrided region of its capping layer both advantageously result in the oxygen content within the structure remaining unaltered and thereby providing enhanced device reliability, stable performance of the resultant FinFETs. The gate structure formation process of FIGS. 3A-3B may further include, for instance, providing a gate material (which in one embodiment, may be a metal gate material) over the nitrided surface of the capping layer and patterning the gate material to define a gate structure 370.

By way of further example, FIGS. 4A-4F depict one detailed embodiment of a method of fabricating a fin-type transistor structure, with one or more conformal nitrided surfaces, of increased concentration of nitrogen, in accordance with one or more aspects of the present invention. Note that, although the present invention may be applicable to both a gate-first process flow and a replacement-metal gate or gate-last process flow, for simplicity, the figures illustrated generally represent a gate-first process flow.

Figure 4A:
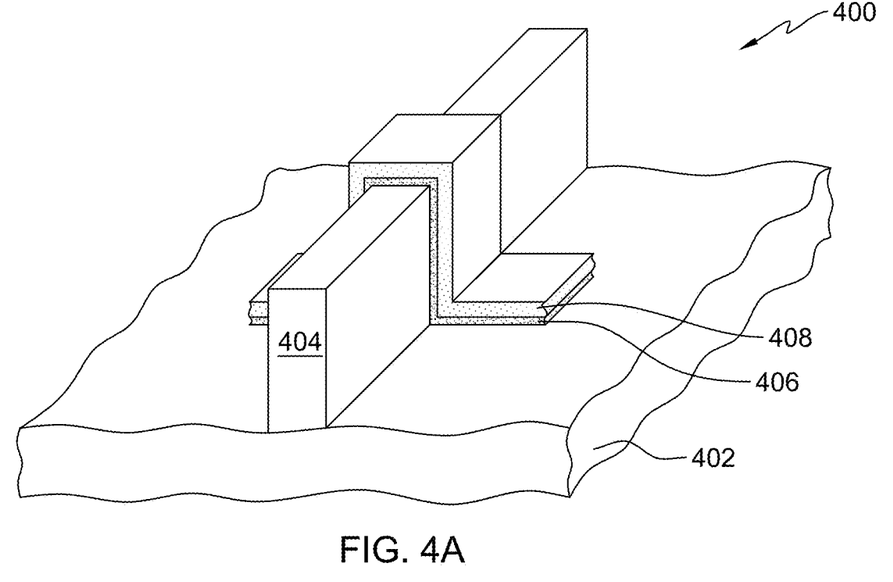
FIG. 4A depicts one embodiment of structure obtained during a fin-type transistor fabrication process, in accordance with one or more aspects of the present invention.

FIG. 4A illustrates one embodiment of a structure 400, obtained during a fin-type transistor fabrication process, in accordance with one or more aspects of the present invention. In the example shown, structure 400 includes a substrate 402, which may be (in one example) a bulk semiconductor material such as a bulk silicon wafer. As another example, substrate 402 may include or be any silicon-containing substrate including, but not limited to, single crystal Si, Si-on-nothing (SON), Si-on-insulator (SOI), or Si-on-replacement insulator (SRI) substrate and the like. Although not depicted in figures, substrate 402 may in addition or instead include various isolations (for example, shallow trench isolation (STI) with silicon oxide-filled within the trench), dopings (such as, for instance, n/p wells) and/or device features. For instance, substrate 402 may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb).

As depicted, one or more fins or fin structures 404 extend from substrate 402 of structure 400. By way of example, fin structures 404 may be formed by removing one or more portions of substrate 402, thereby creating fins 404 of the same material as substrate 402, for example, a semiconductor or crystalline material. In another example, formation of fins 404 may also be achieved by patterning substrate 402 using various techniques, including: direct lithography; sidewall image transfer technique; extreme ultraviolet lithography (EUV); e-beam technique; litho-etch litho-etch; or litho-etch litho-freeze. Following patterning, removal may be performed, for example, by any suitable etching process, such as an anisotropic dry etching process, for instance, reactive-ion-etching (RIE) in sulfur hexafluoride (SF6). Note that, although not depicted in FIGS. 4A-4F for simplicity, a shallow-trench isolation (STI) may be formed in substrate 402 by deposition of silicon-oxide and planarizing using, for instance, chemical mechanical process, followed by a reactive ion etch (RIE) using plasma to reveal fins 404 on surface with-predetermined height.

One or more layers of material may be disposed, in part, conformally over fins 404. The one or more material layers may include, for instance, an interfacial layer 406 and a gate dielectric layer 408 disposed over interfacial layer 406. These noted layers of structure 400 of FIG. 4A may be formed using a variety of different materials and fabrication techniques, such as chemical vapor deposition (CVD), physical vapor deposition (PVD) or plasma-enhanced versions of such processes. The thickness of the depicted layers may also vary, depending on the particular application.

In one embodiment, interfacial layer 406 may include or be fabricated of, for instance, a line or layer of silicon oxide, disposed conformally over fin 404 and substrate 402, which will protect the underlying fin 404 region during subsequent processing. One skilled in the art will note that, interfacial layer 406 may be readily formed conformally over fin 404 via oxidation of, for instance, pure silicon fin material during fabrication processing. The silicon fin material may chemically be oxidized during various pre-clean processes performed using, for instance, dilute hydrofluoric acid (DHF) solution and SC1 solution, often resulting in a thin layer or film of interfacial oxide on the surface of silicon fin material, forming the interfacial layer. In one example, the thickness of interfacial layer may be about 5° A to 10° A.

By way of an example, gate dielectric layer 408 may include an oxide material, such as a metal-oxide material. In one example, the metal-oxide material may be or include a high-k dielectric material with a dielectric constant k greater than about, for instance, 3.9 (note that k=3.9 for $SiO_2$), and may be deposited via a suitable deposition process, such as an atomic layer deposition (ALD), physical vapor deposition (PVD), chemical vapor deposition (CVD), metal-organic chemical vapor deposition (MOCVD), plasma-enhanced CVD (PECVD) or the like. Examples of high-k dielectric materials which may be used as gate dielectric layer 408 include, but are not limited to, hafnium oxide, hafnium silicon oxide, lanthanum oxide, lanthanum aluminum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide and lead zinc niobate. Note that, in the present example, the gate dielectric layer may include an oxide material which may have oxygen vacancies. Although gate dielectric layer 408 may have a suitable thickness, the thickness of gate dielectric layer 408 may vary according to the processing node in which the semiconductor device is being fabricated. In one example, gate dielectric layer 408 may be about 1 nanometers (nm) to 10 nm.

Figure 4B:
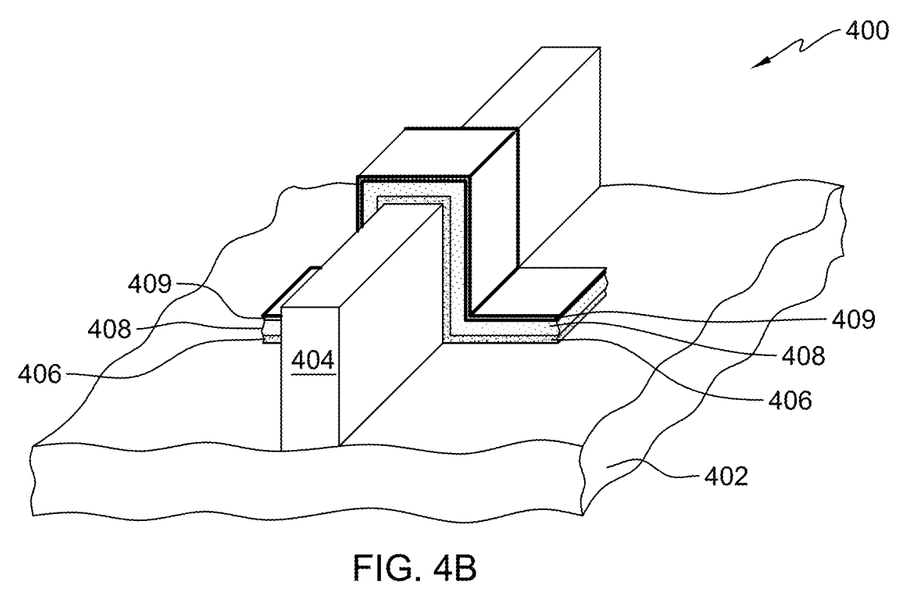
FIG. 4B depicts the structure of FIG. 4A after a first nitridation, to provide an oxynitrided surface of the gate dielectric layer, in accordance with one or more aspects of the present invention.

Referring to FIG. 4B, structure 400 may be subjected to a flash annealing process to facilitate removing one or more oxygen voids (also referred to as oxygen vacancies) disposed within gate dielectric layer 408 (and interfacial layer 406), by incorporating oxygen within the one or more oxygen voids or vacancies. Such oxygen voids may be created within gate dielectric layer 408 and interfacial layer 406 during fabrication, and can cause undesirable affects such as, for instance, work function shift of the high-k dielectric material. By way of an example, the annealing process may be performed in presence of oxygen ($O_2$), for instance, in a "flash" rapid thermal annealing (RTA) chamber, at a temperature in a range of about 900° C. to 1150° C. for less than about 1 sec. In another example, the annealing process may be performed in a conventional furnace anneal at a temperature in a range of about 600° C. to 800° C. This flash annealing process advantageously facilitates in eliminating oxygen vacancies or oxygen voids disposed within the gate dielectric layer.

Continuing with FIG. 4B, a first conformal nitridation process is performed over structure 400, and in particular, over an exposed surface of the gate dielectric layer 408, in accordance with one or more aspects of the present invention. This first conformal nitridation process includes performing a first plasma nitridation over the gate dielectric layer to form a conformal oxynitrided 409 surface, which is rich in nitrogen content, over the exposed surface thereof. In one example, this first plasma nitridation may be performed using a heated plasma process (for instance, a Decoupled Plasma Nitridation (DPN) process), during which an exposed surface of gate dielectric layer 408 may be bombarded with nitrogen ions, typically generated using a nitrogen source, to form a conformal oxynitrided surface 409 over the exposed surface of the gate dielectric layer 408. In one specific example, an outer surface of a gate dielectric layer such as hafnium oxide ($HfO_2$) may be converted to hafnium oxynitride (HfON), resulting in a hafnium oxynitrided (HfON) surface of gate dielectric layer 408. Note that the conformal oxynitrided surface increases concentration of nitrogen over the exposed surface of the gate dielectric layer, resulting in a "nitrogen-rich" outer surface of the gate dielectric layer. In one example, the heated plasma process may be performed, in the presence of a nitrogen source such as, nitrogen gas ($N_2$), at temperature in a range of about 350° C. to 400° C., with a plasma RF power of about 550 W to 1500 W and for a time period of about 50 sec to 150 sec. Alternatively, the heated plasma process could be performed in presence of ammonia gas, acting as a nitrogen source, at temperature of about 350° C. to 400° C., with a plasma RF power of about 750 W to 1700 W and for a time period of about 50 sec to 150 sec. Note that the first plasma nitridation may be performed by controlling process parameters such as, for instance, temperature, rate of gas flow, and operating pressure etc., to control forming oxynitrided surface 409. Note that, oxynitrided surface 409 advantageously facilitates blocking exposure of the underlying gate dielectric layer in subsequent fabrication processes, as well as seals the provided oxygen within the gate dielectric layer 408 and/or interfacial layer 406.

Figure 4C:
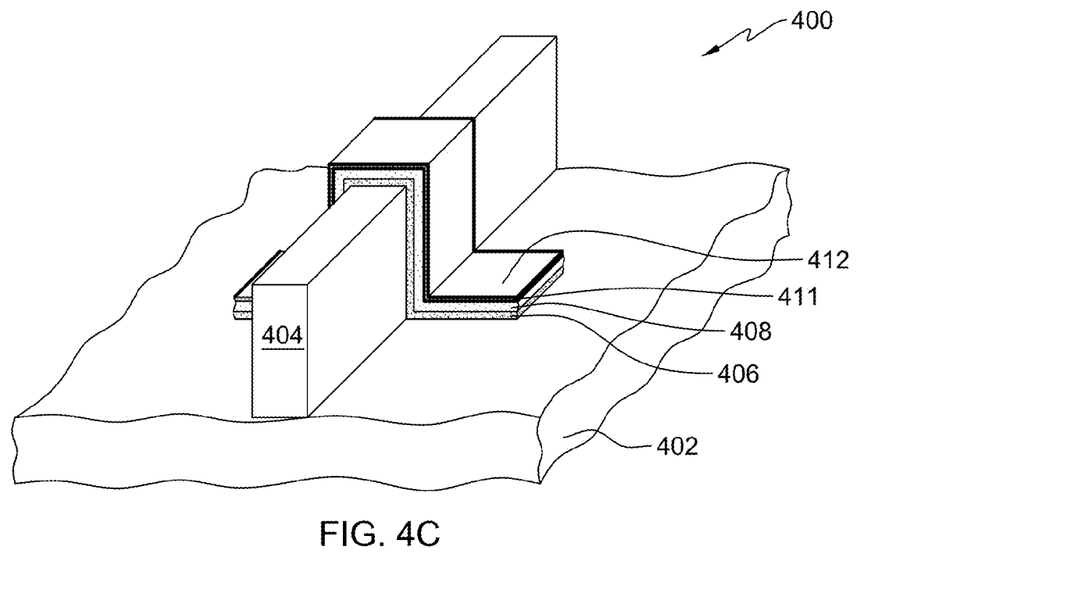
FIG. 4C depicts the structure of FIG. 4B after a post annealing process to form an oxynitrided region of the gate dielectric layer, in accordance with one or more aspects of the present invention.

Structure 400, including conformal oxynitrided 409 of the gate dielectric layer 408, may optionally be subjected to a post fast annealing process. As shown in FIG. 4C, in one embodiment, this post annealing process facilitates at least partially enhancing the nitrogen content on the outer oxynitrided surface of gate dielectric layer 408, for instance, by removing some oxygen atoms escaping from an upper surface of the conformal oxynitrided surface, and in turn, diffusing a minimum amount of nitrogen into an upper portion of the gate dielectric layer. Additionally, diffusion of a minimum amount of nitrogen may convert a portion of the oxide material to an oxynitrided region 411 within an upper portion of the gate dielectric layer. Nonetheless, the nitrogen atoms are not to be diffused into the underlying gate dielectric to avoid degradation of dielectric properties and interface quality. In one specific example, an upper portion of a gate dielectric layer such as hafnium oxide ($HfO_2$) may be converted to hafnium oxynitride (HfON), resulting in a hafnium oxynitrided (HfON) region of gate dielectric layer 408. The oxynitrided region 411 formed within the gate dielectric layer from an outer oxynitrided surface, may be less than about 1 nm to 2 nm. Alternatively, in another embodiment, this post annealing process facilitates partially driving some oxygen atoms away from the conformal oxynitrided surface into ambient atmosphere, forming an oxynitrided region with increased concentration of nitrogen content within the upper portion of the gate dielectric layer. In such an example, the thickness of the conformal nitride layer may be slightly reduced (for instance, less than about 0.5 nm) by the escaping oxygen, while enhancing the concentration of nitrogen on the conformal oxynitrided surface of the gate dielectric layer. Note that this escaping of oxygen and minimum diffusion of nitrogen into the gate dielectric layer increases the concentration of nitrogen within the upper portion thereof. Additionally, this mechanism advantageously results in stabilizing oxygen content in the gate dielectric layer. Further, this post annealing process advantageously facilitates in stabilizing the thickness and characteristics of the underlying layers, for instance, the underlying remaining portion of gate dielectric layer 408 and interfacial layer 406, thus, avoiding an increase in equivalent oxide thickness and interface charges, without affecting a threshold voltage shift of the remaining portion of the gate dielectric layer 408. Additionally, note that the first conformal nitridation process facilitates the dielectric constant of the underlying gate dielectric layer to remain unaltered.

As noted, the post annealing process may be performed using one of a variety of available annealing techniques such as, for example, a rapid thermal anneal (RTA), spike anneal, minute second anneal, laser anneal, flash anneal, microwave anneal, etc. Note these annealing processes need to provide a localized high temperature at the surface of the gate dielectric layer (for instance, for the surface oxygen to escape) to prevent significant atomic movement within underlying layers, thereby resulting in minimum or controlled diffusion of nitrogen within the upper portion of the gate dielectric layer. In one example, a RTA anneal may be performed at a temperature of about 700° C. to 800° C. for about 10 sec to 30 sec. In another example, a spike anneal may be performed at a temperature of about 800° C. to 950° C. in presence of inert gas, such as Argon or in vacuum, having a pressure of less than about 10 mTorr. In another example, an ammonia anneal may be performed at a temperature of about 500° C. to 750° C. for about 5 sec to 60 sec, under reduced pressure. Note that, the annealing process may be performed while controlling process parameters such as temperature and time, to facilitate controlling the rate of diffusion of nitrogen into the upper portion of the gate dielectric layer 408, and without affecting the underlying remaining portion of the gate dielectric layer 408 and the interfacial layer 406. In short, the post annealing can enhance the first nitridation process to form a nitrogen-rich layer on the surface of the gate dielectric layer by sealing and stabilizing the oxygen content inside the gate dielectric layer.

Figure 4D:
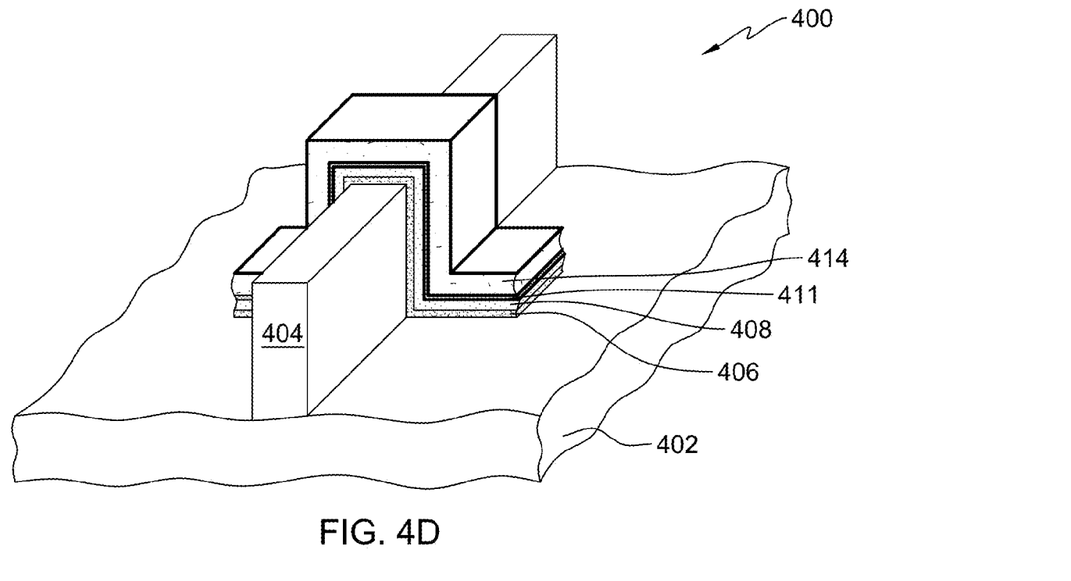
FIG. 4D depicts the structure of FIG. 4C with a capping layer provided over the oxynitrided surface of the gate dielectric layer, in accordance with one or more aspects of the present invention.

As illustrated in FIG. 4D, a capping layer 414 may be provided over gate dielectric layer 408, in accordance with one or more aspects of the present invention. As used herein, "capping layer" refers generally to a material film or layer which overlies, for instance, the gate dielectric layer. The capping layer 414 may, in one embodiment, form part of the resultant gate structure, and may be or include one or more conformally-deposited work function layers. By way of example, capping layer 414 may include or be fabricated of a nitride material, such as, for example, titanium nitride (TiN) or tantalum nitride (TaN), which may be conformally deposited using a variety of techniques such as, for example, chemical vapor deposition (CVD) or atomic layer deposition (ALD). Although capping layer 414 may have any suitable thickness, in one example, the thickness of capping layer may be in the range of about 2 nm to 20 nm nanometers. As discussed above, capping layer 414, could disadvantageously be susceptible to undesirable oxidation processes performed during subsequent fabrication processing, which could result in performance degradation of capping layer 414 and the resultant structure.

Figure 4E:
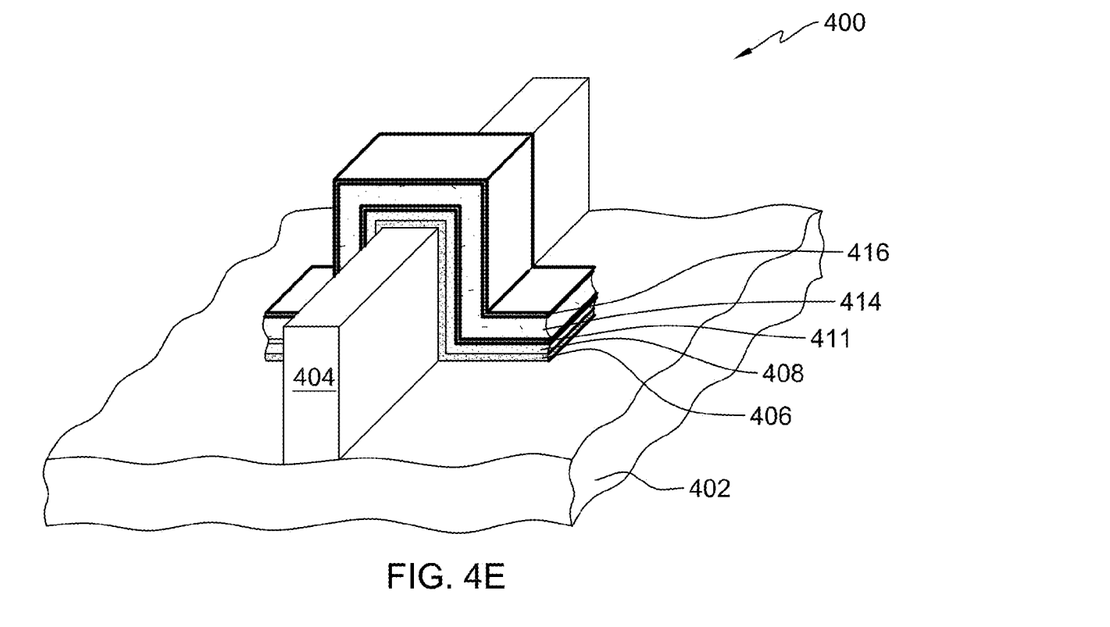
FIG. 4E depicts the structure of FIG. 4D after a second nitridation, to provide a nitrided surface of the capping layer, in accordance with one or more aspects of the present invention

As depicted in FIG. 4E, a second conformal nitridation process may next be performed over structure 400, including over an exposed surface of capping layer 414, in accordance with one or more aspects of the present invention. In one example, this second conformal nitridation process may include performing a second plasma nitridation over the exposed surface of the capping layer. By way of example, this second plasma nitridation may be performed using a heated plasma process (that is, a Decoupled Plasma Nitridation (DPN) process), during which an exposed surface of capping layer 414 may be bombarded with nitrogen ions, which may be generated using a nitrogen source, to deposit a conformal nitrided surface 416 conformally over the exposed surface. In one example, the heated plasma process may be performed, in the presence of nitrogen gas source, at a temperature of about 350° C. to 400° C., with a plasma RF power of about 550 W to 1500 W for a time period of about 50 sec to 150 sec. Alternatively, the heated plasma process could be performed, in the presence of an ammonia gas source, at a temperature of about 350° C. to 400° C., with a plasma RF power of about 750 W to 1700 W and for a time period of about 75 sec to 200 sec. In one embodiment, the second plasma nitridation over the exposed surface of capping layer 414 is performed at a higher temperature than the first plasma nitridation, discussed above in connection with FIG. 4B, owing to the presence of a relatively chemically-inert capping layer 414 compared to gate dielectric layer 408. Conformal nitrided surface 416 advantageously facilitates blocking exposure of the capping layer to subsequent fabrication processes, as well as facilitates sealing suitable contaminants such as, carbon, fluorine, within the capping layer for desirable properties. One skilled in the art will note that the suitable contaminants (such as carbon) may be deposited within the capping layer during its deposition process.

Figure 4F:
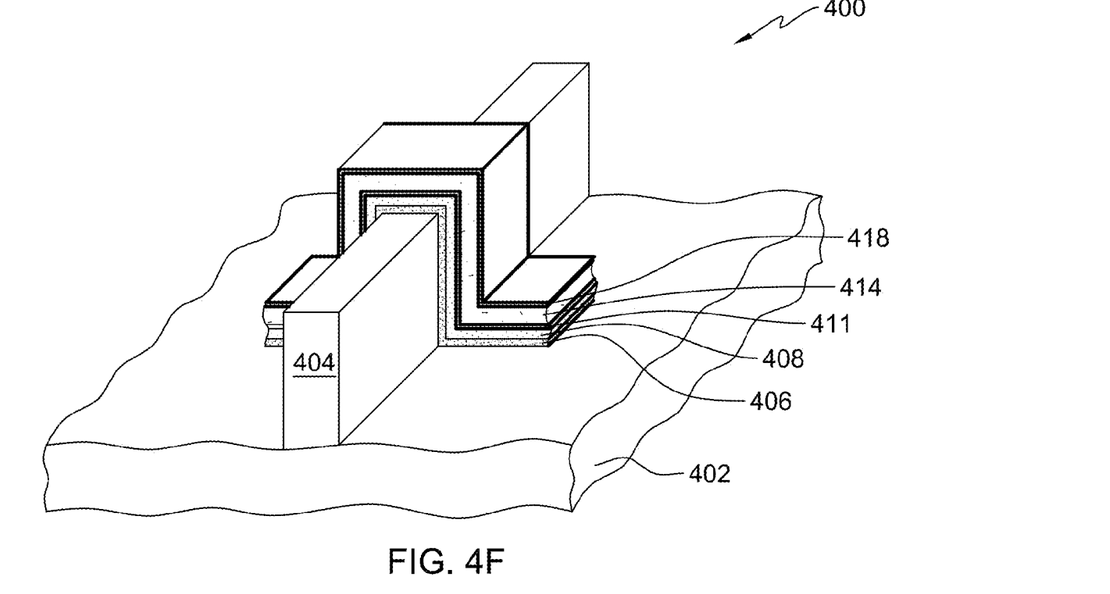
FIG. 4F depicts the structure of FIG. 4E after a post annealing process to form a nitrided region of the capping layer, in accordance with one or more aspects of the present invention.

Structure 400, including conformal nitrided surface 416 of capping layer 414 may optionally be subjected to a post annealing process, in the presence of nitrogen ambient. In one embodiment, this post annealing process advantageously results in enhancing nitrogen content in the conformal nitrided surface 416 and diffusing a minimum amount of nitrogen into an upper portion of capping layer 414, and forming a nitrided region 418 within the upper portion of capping layer 414. The nitrided region 418 formed into capping layer 414 from the outer nitrided surface may be less than about 1 to 2 nanometers. Note that in a further aspect, this second post annealing process advantageously enhances the nitrogen content in the conformal nitrided surface 416 to facilitate sealing or stabilizing the nitrogen in the capping layer as well as the oxygen content in the underlying gate dielectric layers. Note that the post annealing advantageously increases the concentration of nitrogen within the upper portion of capping layer 414, and thereby provides the capping layer with a densified nitrided surface. Additionally, this diffusion of nitrogen into the upper portion of the capping layer advantageously results in the overall densification of the capping layer. Further, this nitrided region 418 advantageously inhibits the formation of undesirable nitrogen or oxygen in the capping layer during subsequent fabrication processing. Note that, this post annealing process also stabilizes the thickness of the underlying layers, for instance, the underlying remaining portion of capping layer 414, and thus, avoids any increase in equivalent oxide thickness, without resulting in a threshold voltage shift of capping layer 414.

By way of example, the post annealing process may be performed using one of a variety of available annealing techniques such as, for example, rapid thermal anneal (RTA), spike anneal, laser anneal, flash anneal, microwave anneal, etc. In one example, a soak anneal may be performed at a temperature of about 700° C. to 800° C. for about 10 sec to 30 sec. In another example, a spike anneal may be performed at a temperature of about 800° C. to 950° C. in the presence of inert gas, such as Argon or in vacuum, having a pressure of less than about 10 mTorr. In another example, an ammonia anneal may be performed at a temperature of about 500° C. to 750° C. for about 5 sec to 60 sec, under reduced pressure. Note that, in one embodiment, the post annealing process performed to create nitrided region 418 with enhanced nitrogen content of the capping layer 414, may utilize substantially higher temperatures compared to the post annealing process performed to create the oxynitrided region of the gate dielectric layer, described above, owing to the more robust nitrided region 418 of the capping layer. For instance, the nitrided region 418 of the capping layer, may have a thickness, in a range of about 1 nm to 2 nm. Note that, this thickness of nitrided region 418 disposed within the upper portion of the capping layer may be different from the thickness of the oxynitrided region 411 disposed within the upper portion of the gate dielectric layer. In short, the post annealing can enhance the second nitridation process performed to form a nitrogen-rich layer on the surface of the capping layer by sealing and stabilizing the nitrogen content inside the capping layer.

Figure 4G:
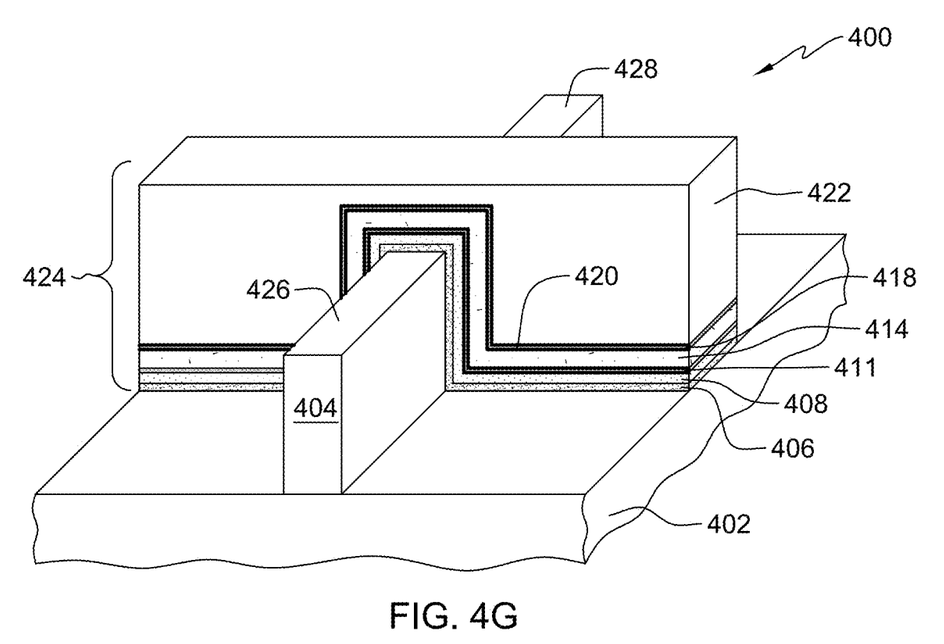
FIG. 4G depicts the structure of FIG. 4F after, for instance, an gate material has been provided over the nitrided surface of the capping layer, in accordance with one or more aspects of the present invention.

As depicted in FIG. 4G, a gate material 422 may be provided over capping layer 414 to create a gate structure 424. Note that, in one embodiment, the gate material 422 may include or be fabricated of a metal gate, as part of a gate-first fabrication process. Alternatively, in another embodiment, may include or be a sacrificial gate material, such as amorphous silicon (a-Si) or polycrystalline silicon (polysilicon), which may subsequently be replaced with a replacement gate material, as part of a gate-last fabrication process. The fabrication process may proceed further to include a source region 426 and drain region 428, typically formed using any suitable techniques, including, for example, ion implantation, epitaxial growth of the embedded source/drain materials and activation anneals.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   fabricating a fin-type transistor structure, the fabricating comprising:
   forming at least one material layer disposed conformally over a fin extending above a substrate, the at least one material layer comprising a gate dielectric layer with an exposed surface; and
   performing a conformal nitridation process on the exposed surface of the pre-formed gate dielectric layer, the conformal nitridation process forming an exposed, conformal nitrided surface with an increased nitrogen concentration as compared to an underlying portion of the gate dielectric layer.

2. The method of claim 1, wherein performing the conformal nitridation process comprises performing a plasma nitridation of the exposed surface of the gate dielectric layer.

3. The method of claim 2, wherein performing the conformal nitridation process further comprises performing a flash annealing process over the gate dielectric layer, prior to performing the plasma nitridation over the gate dielectric layer, the flash annealing process facilitating removing one or more oxygen voids within the gate dielectric layer.

4. The method of claim 3, wherein the flash annealing process comprises an oxygen flash annealing process.

5. The method of claim 1, wherein the at least one material layer is multiple material layers, the multiple material layers being conformally disposed, at least in part, over the fin extending above the substrate, and comprising a capping layer disposed above the gate dielectric layer.

6. The method of claim 5, wherein performing the conformal nitridation process comprises performing the conformal nitridation process over the gate dielectric layer, prior to providing the capping layer over the gate dielectric layer.

7. The method of claim 5, further comprising performing a second plasma nitridation over an exposed surface of the capping layer.

8. The method of claim 7, wherein the second plasma nitridation forms an exposed, conformal nitrided surface for the capping layer, and the method further comprises performing a post annealing process, subsequent to the second plasma nitridation, to at least partially diffuse nitrogen into the capping layer, the at least partially diffused nitrogen forming a nitrided region within an upper portion of the capping layer.

9. The method of claim 5, wherein the gate dielectric layer comprises an oxide material and the capping layer comprises a nitride material.

10. The method of claim 1, wherein the method further comprises performing a post annealing process, subsequent to the plasma nitridation of the gate dielectric layer, to at least partially diffuse nitrogen from the exposed, conformal oxynitrided surface into the underlying portion of the gate dielectric layer, the at least partially diffused nitrogen in the upper portion of the gate dielectric layer forming a oxynitrided region within an upper portion of the gate dielectric layer.

11. The method of claim 10, wherein the post annealing process increases the concentration of nitrogen within conformal, oxynitrided surface of the gate dielectric layer.

12. The method of claim 1, wherein the plasma nitridation process is performed in the presence of a gaseous plasma material to form the exposed, conformal nitride surface.

13. The method of claim 12, wherein the gaseous plasma material comprises at least one of nitrogen gas or ammonia gas.

14. The method of claim 12, wherein the plasma nitridation process is performed at a temperature within a range of about 350° C. to 400° C.

15. The method of claim 1, wherein performing the conformal nitridation process further comprises performing a post annealing process, subsequent to performing the plasma nitridation, to at least partially diffuse nitrogen from the exposed, conformal nitrided surface into the underlying portion of the gate dielectric layer.

16. The method of claim 15, wherein the post annealing process comprises performing at least one of a rapid-thermal (RTA) annealing process, a spike annealing process or a minute second process over the exposed, conformal nitrided surface.

17. The method of claim 1, wherein the at least one material layer is formed via a process that differs from the conformal nitridation process.

18. The method of claim 1, wherein the at least one material layer is formed via at least one deposition process selected form the group consisting of atomic layer deposition (ALD), physical vapor deposition (PVD), chemical vapor deposition (CVD), metal-organic chemical vapor deposition (MOCVD) and plasma-enhanced CVD (PECVD).

* * * * *